United States Patent [19]

Yau et al.

[11] Patent Number: 4,540,251

[45] Date of Patent: Sep. 10, 1985

[54] THERMO-MECHANICAL OVERLAY SIGNATURE TUNING FOR PERKIN-ELMER MASK ALIGNER

[75] Inventors: David W. T. Yau, Hopewell Junction; Robert A. Modavis, Painted Post, both of N.Y.

[73] Assignee: International Business Machines Corporation, Armonk, N.Y.

[21] Appl. No.: 557,018

[22] Filed: Dec. 1, 1983

[51] Int. Cl.³ .............................................. G02B 5/10
[52] U.S. Cl. .................................. 350/611; 350/320; 355/52; 355/30
[58] Field of Search ....................... 350/6.7, 6.11, 320; 355/52, 45, 43, 30

[56] References Cited

U.S. PATENT DOCUMENTS 4,175,835 11/1979 Kuhn .
4,408,874 10/1983 Zinky et al. ........................... 355/52
4,422,725 12/1983 Prewo .

FOREIGN PATENT DOCUMENTS 3202887 of 0000 Fed. Rep. of Germany .
1232209 of 0000 France .
 483026 of 0000 Switzerland .
2071401 of 0000 United Kingdom .

OTHER PUBLICATIONS

John W. Hardy, "Active Optics . . . Light", Proceedings of IEEE, vol. 66, No. 6, 6-1978, pp. 674-684.

Primary Examiner—John K. Corbin
Assistant Examiner—Lynn Vandenburgh Kent
Attorney, Agent, or Firm—Sughrue, Mion, Zinn, Macpeak, and Seas

[57] ABSTRACT

Thermoelectric heat pumps are individually located at multiple flexures functioning to support a primary mirror which mirror reflects light from an aluminum mask onto a semiconductor wafer. The heat pumps are selectively energized to apply thermal stresses by heat or cold application at the flexures into the primary mirror suspension to compensate for distortions in the image transfer between the mask and the semiconductor wafer.

6 Claims, 3 Drawing Figures

THERMO-MECHANICAL OVERLAY SIGNATURE TUNING FOR PERKIN-ELMER MASK ALIGNER

FIELD OF THE INVENTION

This invention relates to fine tuning individual overlay signatures to match a base line tool, and more particularly, to an arrangement for minimizing misalignment by changing thermal gradients within the equipment itself.

BACKGROUND OF THE INVENTION

In photolithography, overlay is defined as the layer to layer registration performance; overlay error is the runout error between layers at various sites on the wafer. In the fabrication of microminiaturized components, as for example in the production of solid state devices, thousands of the devices are produced in a single wafer of semiconductive material using a multistep photomechanical reproduction process, by photolithography. The pattern depicted on the mask, by photo imaging, is applied to a repetitive array of a single element of a multi-element array required for the fabrication of the device, and then by a succession of alignment and fabricating steps, the completion of a finished product. Conventionally, Perkin-Elmer mask aligners are used in the achievement of these ends. Such Perkin-Elmer mask aligners are found to possess systematic overlay errors or overlay signatures. These overlay signatures are quite different from one aligner to the other, but depend upon the unique characteristic optical distortions of the particular tool.

Analyzing the overlay signatures from different Perkin-Elmer mask aligners, it was determined that each individual tool's signature can be further separated into its linear components, measured by its Y-axis magnification along the imaging annular ring field, and its non-linear component, measured by top to bottom magnification balance, local distortions and straightness of Y-axis.

Typically, there exist four kinds of signature error: i.e. magnification error of other than one to one; non-uniform magnification error over the field of exposure typically top to bottom, i.e. one-half field; non-uniform magnification over the field of exposure within a half thereof, i.e., one-fourth field of exposure; and, non-linearity of image, i.e. bow in the direction of the optical axis.

The linear component can be changed to match that of the base-line tool by tool-enclosure temperature tuning. However, the non-linear component of tool signature can be matched heretofore only with tools that have similar signatures. Vendor specification such as that of the (Perkin-Elmer corporation) only guarantees plus or minus $10\mu''$/site to contact standard or $\pm 20\mu''$/site tool to tool. However, Applicant's assignee overlay specification, for 78 G. R. (Ground Rule) and 80 G.R., are $\pm 10\mu''$/site and $\pm 7\mu''$/site, tool to tool respectively. Currently, only 40 percent of existing tools are capable of meeting the 78 G. R. (or 15 percent for 80 G. R.).

It is, therefore, a primary object of the present invention to provide a method and apparatus for compensating distortions arising in an optical mask alignment apparatus to permit fine tuning of individual Perkin-Elmer or like overlay signatures to match those of base line tools for upgrading ground rule performance and to recover tools having mismatched signatures.

SUMMARY OF THE INVENTION

The invention is directed to a method and an apparatus for practicing the method whereby tool signature is reduced by controllably stressing the primary mirror in the photolithography equipment for manufacturing semiconductor devices. The method and apparatus feature use of a standard mask set and controllable heat pumps located at the primary mirror flexures for thermally stressing the flexures to compensate signature.

Specifically, in an optical mask alignment apparatus, the apparatus includes a first stage for receiving a semiconductor wafer, a second stage for receiving a mask, alignment means for aligning the mask and wafer relative to each other, an illuminator for illuminating the mask to form an image thereof and image transferring means for transferring the mask image to the wafer. The image transferring means include the primary mirror suspended by a system of flexures. The improvement resides in heat pumps located at the flexures and in thermal transfer relationship thereto for adjusting the temperature of the flexure to establish stresses in the primary mirror suspension which are transferred to the primary miror so as to compensate distortions in the image transfer means with the heat pumps energized to supply heat or cold as needed. The invention is further directed to the method for accomplishing that purpose whose steps involve:

providing a reference substrate;
providing a reference mask;
illuminating the mask to form an image thereof;
transforming the image of the mask to the substrate;
adjusting the mask—wafer relative positioning so that the mask image aligns with the substrate; and
adjusting the temperature of the primary mirror flexure system by applying heat or cold thereto so as to stress the flexures and associated primary mirror to reduce misalignment of the mask cause by distortions in the image transfer means.

DESCRIPTION OF THE PREFERRED EMBODIMENT

Figure 1:
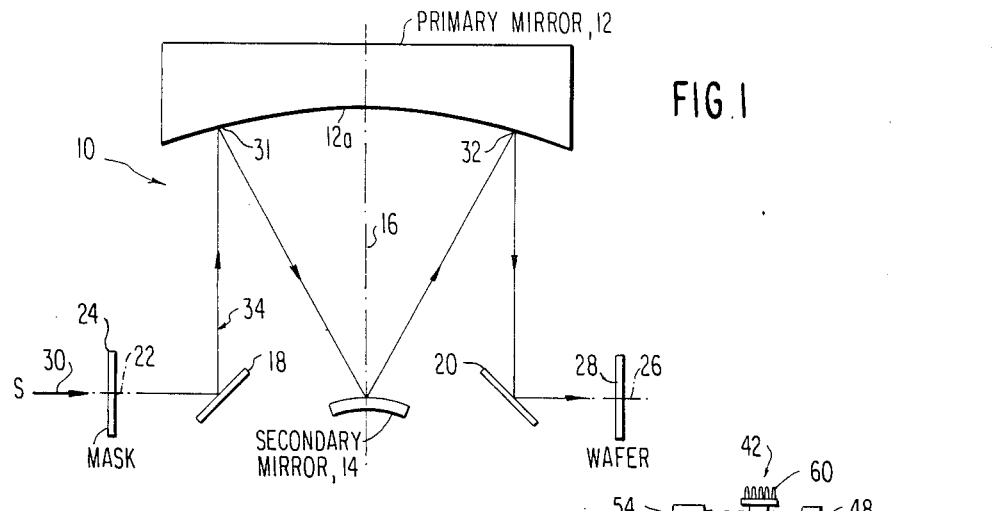
FIG. 1 is a schematic view of a typical Perkin-Elmer projection optical system for the photolithography manufacture of semiconductive devices to which the present invention has application.

Referring to FIG. 1, there is illustrated schematically a typical Perkin-Elmer projection optical system indicated generally at 10. The system constitutes an all reflective mirror projection optical system composed of a single primary mirror 12, a single secondary mirror 14 on a common optical axis 16 and two 45 degree folding mirrors 18 and 20. One folding mirror is on the mask side and is aligned with the optical axis 22 of mask 24, while the other is on the wafer side and is aligned with the axis 26 of the wafer 28. Light rays from a source S traveling in the direction of arrow 30 and passing through the mask 24 form an image defined by the pattern of mask 24. The light rays travel from left to right, first folded by 45 degree mirror 18 to the left half 31 of the primary mirror 12, reflected to the convex surface of secondary mirror 14 and back to the right half of primary mirror 12 at 32. They reflect one more time to 45 degree mirror 20 and finally the rays fold to the wafer 28. The optical path for the rays is indicated generally at 34.

Figure 2:
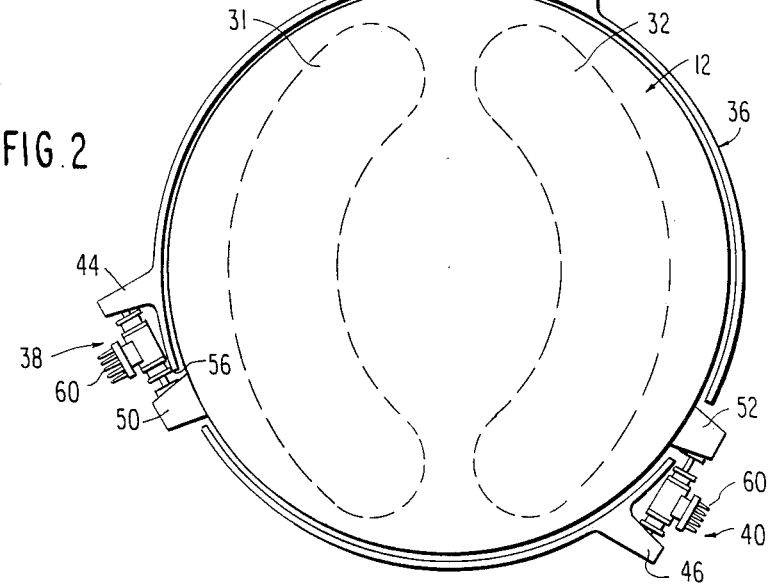
FIG. 2 is a vertical elevational view of a primary mirror suspension system for the primary mirror of the apparatus of FIG. 1 incorporating the thermal mechanical overlay signature tuning system forming a preferred embodiment of the present invention.

Typically, a 10 inch diameter primary mirror 12 may weight approximately 25 pounds, and this heavy mirror is suspended in a vertical upright position by three supporting flexures as shown in FIG. 2 to equalize the stress of its own weight and facilitate alignment to the fixed secondary mirror 14. FIG. 2 shows the primary mirror 12 in disc form, and being mounted to a large, circular casted housing 36 by means of left supporting flexure 38, right supporting flexure 40 and top supporting flexure 42. Flexures 38, 40 and 42 are fixed at one end to the casted housing 36, specifically at radially projecting arms as at 44, 46 and 48, respectively, for left supporting flexure, right supporting flexure, and top supporting flexure 38, 40 and 42. The opposite ends of the flexures are connected to the primary mirror radial tabs 50, 52 and 54 which tabs project through three equally circumferentially spaced slots 56 within the annular casted housing 36. Tab 50, therefore, mounts one end of the left supporting flexure 38, tab 52 mounts one end of the right supporting flexure 40, and tab 54 mounts the end of the top supporting flexure 42 not mounted to casted housing arm 48.

FIG. 2 shows in dotted lines the second and first reflection as at 32 and 31, respectively. To the extent described, the schematic representative of FIG. 1 and the primary mirror and its flexure mount is conventional and is typical of an apparatus employed in the manufacture of integrated circuits by the photolithographic replication of patterns from the mask onto a silicon wafer surface treated with a photoresist material. Under such operations by conventional procedures such as developing, plating, etching, etc., a series of process steps may be repeated a number of times on a single wafer, with each pattern overlying patterns previously applied.

In the past, however, there has been no means for compensating signature. Signature is dealt with by grouping tools according to their signature and selecting tools of normal minimal signature difference for use in high accuracy applications. With increasing miniaturization, the pattern elements have become smaller and smaller to the extent that pattern resolution is limited by the wavelength of light. The present invention method limits tool signature by controllably thermally stressing the apparatus primary mirror to compensate for signature. The essence of the invention is the application of a thermoelectric heat pump (heater/cooler) 60 to each of the flexures 38, 40 and 42. As such each thermoelectric heat pump 60 is capable of generating temperatures up to plus or minus 30° F. from abient. They are mounted along the longitudinal axis of the supporting flexures and in contact therewith and function to regulate the temperature of the supporting flexures of the primary mirror 36. By applying heat or cold, and selectively increasing or decreasing the temperature of the flexures, there are generated minute pushing and pulling stress ($\sim$0–2$\mu$) actions on the flexures 38, 40, 42 which will, in turn, affect the surface quality of the primary mirror, i.e. the concave reflecting surface 12a of that primary mirror. By properly combining the pushing and pulling stress, there will be a reduction or compensation of any residue surface errors on the primary mirror to match one aligner signature to those of other tools.

Experimental data as illustrated in Table I below evidences that fact that this technique produces very stable and useful change on Perkin-Elmer tool signatures.

TABLE I

|  | Flexure Temp | St. Of Axis | Top-bottom Balance | Y-Axis Local Dist. ($\mu''$) | Y-mag. |
|---|---|---|---|---|---|
| Run 1 | 83.4° F. | 12$\mu''$ | −27$\mu''$ | −16/1/−1/13 | −2$\mu''$ |
| Run 2 | 73.0° F. | 12$\mu''$ | 3.5$\mu''$ | −2/3.5/−1/−1 | −.5$\mu''$ |
| Run 3 | 63.0° F. | 13$\mu''$ | 12$\mu''$ | −1/4/−2/−5 | −2$\mu''$ |
| Run 4 | 46.0 F. | 10$\mu''$ | 47$\mu''$ | 13/9/−5/−20 | −3$\mu''$ |

From the results of the four runs illustrated in Table I, one may observe top/bottom balance-parity change with flexure temperature change. Similar parity changes are also evident for the first and fourth Y-axis local distortions. These results are obtained with temperature change on the top flexure only. The runs, however, evidence the fact that extremely fine tuning can be effected by dual or three flexure thermal-mechanical tuning.

Figure 3:
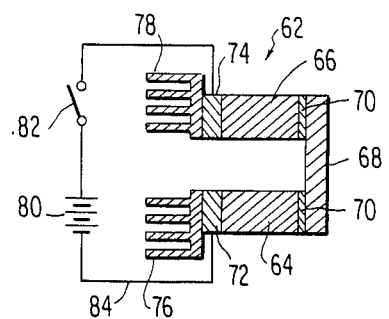
FIG. 3 is a schematic cross-sectional view of a thermal electric device functioning as a refrigerator and depicting one of two modes for the thermal electric heat pumps forming the principal elements of the overlay signature tuning system of FIG. 2.

The thermo-electric heat pumps 60 are readily commerically available. They may comprise units manufactured by the Cambridge Thermionic Corporation under the trademark CAMBION. The devices are solid state, and depending upon the direction of the direct current flow through the devices themselves, supply heat or cold to the junction of two legs of such devices. Reference to FIG. 3 shows schematically how such thermoelectric devices function to achieve the application of cold on a contact surface at the junction of two legs thereof. Thermoelectric device indicated generally at 62 comprises a positive thermoelectric element 64, and a negative thermoelectric element 66. Elements 64 and 66 are provided respectively with P and N type doping materials in a conventional semiconductor sense. An electrically conducting metal plate or strip 68 is joined to the end faces of members 64 and 66 to provide good electrical and thermal contact therewith and forming a cold junction of the thermoelectric device 62.

To insure low impedance conductivity both electrically and thermally, the end faces of elements 64 and 66 may have a thin coating of a high conductivity metal such as silver applied thereto as at 70. Metal plates 72 and 74 may be applied to the other ends of elements 64 and 66, and the assembly completed by heat dissipating members 76 and 78. Members 76, 78 may be bonded to conductor plates 72 and 74, respectively and these members terminate in heat dissipating fins. A battery or source 80 of direct current is connected via switch 82 and leads 84 to conductors 72 and 74 to effect temperature reduction at plate 68 as a result of electrical current flowing therethrough. With the electrical current flowing through the elements 64 and 66 under the set up shown, cooling is achieved at the cold junction defined by plate 68. If the current is reversed, heat will be generated and plate 68 will function as a hot junction. While the schematic representation of FIG. 3 does not show the nature of reversing the current flow, this is easily effected. By reversing current flow, the device illustrated constitutes a thermoelectric heat pump since it selectively causes junction defined by plate 68 to either increase in temperature or decrease in temperature depending upon the direction of current flow. It is a selectively employed cold plate or hot plate such as 68 which contacts the flexure at each of the three mounting points for the primary mirror which permits the thermoelectric heat pump 60 in FIG. 2 to create in a localized manner the thermal stresses necessary to modify the primary mirror signature and to match the signature of the primary mirror to the other elements of the apparatus.

As may be appreciated, as a result of the present invention, by the utilization of one or more thermoelectric heat pumps 60 in effective heat conductive relationship to the flexures, active tuning of the Perkin-Elmer overlay signature is achieved with the realization of a significant technological breakthrough of the present technique of passive tool signature grouping/matching method. The thermomechanical signature overlay tuning system of the present invention has significant potential in bringing/recovering tools with mismatched signatures to 78 G. R. tool sets while permitting upgrade of 78 G. R. tools to 80 G. R. tool sets and improving the overlay and performance on all Perkin-Elmer or like aligners.

While the system has particular application to Perkin-Elmer aligners, it will perform the same function where a primary mirror is supported by means of flexures capable of permitting the transmission by heat or cold application induced via thermal stress to the primary mirror and by way of the mechanical stress induced in portions of the mirror, significantly modulate the overlay signature. The invention's primary concern is the reduction of tool signature in optical mask aligning equipment in which the alignment error rises in the equipment due to flaws in the optical components, assembly alignment limitations and variations in component thermal conditions during operation. Advantageously, the method and apparatus feature the use of a standard mask effect but employs controllable heat pumps located at the primary mirror's support flexures for thermally stressing the flexures to compensate signatures.

In practicing the invention, the standard mask set is mounted in the alignment apparatus, and subsequently one or more heat pumps are adjusted until overlay error is minimized.

While the invention has been particularly shown and described with reference to a preferred embodiment thereof, it will be understood by those skilled in the art that various changes in form and details may be made therein without departing from the spirit and scope of the invention.

We claim:

1. In an optical mask aligning apparatus used in the manufacturing of semiconductor devices by photolithography, said apparatus including:
    a first stage for receiving the semiconductor wafer;
    a second stage for receiving a mask;
    alignment means for aligning the mask and wafer relative to each other;
    an illuminator for illuminating the mask to form an image thereof;
    an image transferring means for transferring the mask image to the wafer;
    said image transferring means including a primary mirror suspended by a system of flexures;
    the improvement comprising:
    a reversible heat pump in thermal conductivity relationship to at least one of said flexures for adjusting the temperature of the flexure to establish stresses in the primary mirror suspension which are transferred to the primary mirror so as to compensate distortion in the image transfer means.

2. The apparatus as claimed in claim 1, wherein individual heat pumps are located at each of said flexures.

3. The apparatus as claimed in claim 1, wherein said heat pump comprises a thermo-electric heat pump.

4. The apparatus as claimed in claim 3, wherein said thermo-electric heat pump is mounted to said flexure in contact therewith and extends along the length of said flexure.

5. A method for compensating distortions arising in optical mask alignment apparatus, said apparatus including:
    a first stage for receiving a semiconductor substrate,
    a second stage for receiving a mask,
    means for aligning the substrate and the mask relative to each other,
    an illuminator for illuminating the mask and forming an image thereof,
    an image transferring means for transferring the mask image to the substrate,
    said image transferring means including a primary mirror suspended from a system of flexures,
    said method comprising the steps of:
    providing a reference substrate;
    providing a reference mask;
    illuminating the mask to form an image thereof;
    transferring the image of the mask to the substrate;
    adjusting the mask-wafer relative to positioning so that mask image aligns with the substrate; and
    heating or cooling the primary mirror flexure system to adjust their temperature so as to stress the flexures and associated primary mirror to reduce misalignment of the mask image caused by distortions in the image transfer means.

6. The method as claimed in claim 5, wherein said step of heating or cooling the primary mirror flexure system comprises the step of electrically energizing a thermo-electric heat pump in thermal conductivity relationship with at least one of said flexures.

* * * * *